(12) United States Patent
Verma et al.

(10) Patent No.: US 11,094,599 B2
(45) Date of Patent: Aug. 17, 2021

(54) SEMICONDUCTOR STRUCTURE AND MANUFACTURING METHOD THEREOF

(71) Applicant: United Microelectronics Corp., Hsinchu (TW)

(72) Inventors: Purakh Raj Verma, Singapore (SG); Kuo-Yuh Yang, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/811,830

(22) Filed: Mar. 6, 2020

(65) Prior Publication Data

US 2020/0211899 A1 Jul. 2, 2020

Related U.S. Application Data

(63) Continuation-in-part of application No. 16/054,963, filed on Aug. 3, 2018, now Pat. No. 10,636,892.

(30) Foreign Application Priority Data

Jun. 28, 2018 (CN) .......................... 201810686336.6

(51) Int. Cl.
*H01L 29/66* (2006.01)
*H01L 21/8249* (2006.01)
(Continued)

(52) U.S. Cl.
CPC .... *H01L 21/8249* (2013.01); *H01L 21/76898* (2013.01); *H01L 21/84* (2013.01);
(Continued)

(58) Field of Classification Search
CPC combination set(s) only.
See application file for complete search history.

(56) References Cited

U.S. PATENT DOCUMENTS

| 5,583,059 A | 12/1996 | Burghartz |
| 6,936,910 B2 | 8/2005 | Ellis-Monaghan et al. |

(Continued)

FOREIGN PATENT DOCUMENTS

| CN | 1479367 | 3/2004 |
| CN | 1512595 | 7/2004 |

(Continued)

OTHER PUBLICATIONS

"Office Action of China Counterpart Application", dated Jun. 2, 2021, pp. 1-12.

*Primary Examiner* — Niki H Nguyen
(74) *Attorney, Agent, or Firm* — J. C. Patents

(57) ABSTRACT

A semiconductor structure including a substrate, a complementary metal oxide semiconductor (CMOS) device, a bipolar junction transistor (BJT), and a first interconnect structure is provided. The substrate has a first side and a second side opposite to each other. The CMOS device includes an NMOS transistor and a PMOS transistor disposed on the substrate. The BJT includes a collector, a base and an emitter. The collector is disposed in the substrate. The base is disposed on the first side of the substrate. The emitter is disposed on the base. A top surface of a channel of the NMOS transistor, a top surface of a channel of the PMOS transistor and a top surface of the collector of the BJT have the same height. The first interconnect structure is electrically connected to the base at the first side of the substrate and extends to the second side of the substrate.

28 Claims, 13 Drawing Sheets

(51) Int. Cl.
*H01L 21/768* (2006.01)
*H01L 27/06* (2006.01)
*H01L 27/12* (2006.01)
*H01L 21/84* (2006.01)

(52) U.S. Cl.
CPC ...... *H01L 27/0623* (2013.01); *H01L 27/1203* (2013.01); *H01L 29/66242* (2013.01)

(56) References Cited

U.S. PATENT DOCUMENTS

| | | |
|---|---|---|
| 7,348,632 B2 | 3/2008 | Kang et al. |
| 7,622,357 B2 | 11/2009 | Vaed et al. |
| 10,636,892 B2 * | 4/2020 | Verma ............... H01L 21/76898 |
| 2005/0098852 A1 | 5/2005 | Kerr et al. |
| 2005/0104127 A1 * | 5/2005 | Kang ..................... H01L 21/84 |
| | | 257/350 |
| 2006/0121667 A1 * | 6/2006 | Bae ..................... H01L 21/8249 |
| | | 438/202 |
| 2007/0287234 A1 | 12/2007 | Kang et al. |
| 2009/0289279 A1 * | 11/2009 | Khare ................. H01L 21/8249 |
| | | 257/190 |
| 2015/0287642 A1 * | 10/2015 | Chang ................ H01L 27/0623 |
| | | 438/236 |

FOREIGN PATENT DOCUMENTS

| | | |
|---|---|---|
| CN | 101266969 | 9/2008 |
| CN | 101425536 | 5/2009 |
| CN | 106601753 | 4/2017 |
| KR | 20040038379 | 5/2004 |

\* cited by examiner

SEMICONDUCTOR STRUCTURE AND MANUFACTURING METHOD THEREOF

CROSS-REFERENCE TO RELATED APPLICATION

This application is a continuation-in-part application of and claims the priority benefit of U.S. application Ser. No. 16/054,963, filed on Aug. 3, 2018, now allowed, which claims the priority benefit of China application serial no. 201810686336.6, filed on Jun. 28, 2018. The entirety of each of the above-mentioned patent applications is hereby incorporated by reference herein and made a part of this specification.

BACKGROUND OF THE INVENTION

Field of the Invention

The invention relates to a semiconductor structure and a manufacturing method thereof, and particularly relates to a semiconductor structure and a manufacturing method thereof which can have better overall performance.

Description of Related Art

In some applications of the semiconductor structure, the semiconductor structure may integrate a variety of semiconductor devices. For example, a radio frequency switch (RF switch), a low-noise amplifier (LNA), and a power amplifier (PA) may be integrated in a radio frequency front-end module (RF FEM). Therefore, how to effectively enhance the overall performance of the semiconductor structure is currently a goal to be achieved in the industry.

SUMMARY OF THE INVENTION

The invention provides a semiconductor structure and a manufacturing method thereof which can have better overall performance.

The invention provides a semiconductor structure, which includes a substrate, a complementary metal oxide semiconductor (CMOS) device and a bipolar junction transistor (BJT). The CMOS device includes an N-type metal oxide semiconductor (NMOS) transistor and a P-type metal oxide semiconductor (PMOS) transistor disposed on the substrate. The BJT includes a collector, a base and an emitter. The collector is disposed in the substrate. The base is disposed on the substrate. The emitter is disposed on the base. A top surface of a channel of the NMOS transistor, a top surface of a channel of the PMOS transistor and a top surface of the collector of the BJT have the same height.

According to an embodiment of the invention, in the semiconductor structure, the substrate may include an insulating layer and a semiconductor layer located on the insulating layer. The collector may be disposed in the semiconductor layer.

According to an embodiment of the invention, in the semiconductor structure, the BJT is, for example, a heterojunction bipolar transistor (HBT).

According to an embodiment of the invention, in the semiconductor structure, the collector and the emitter may have a first conductive type, and the base may have a second conductive type.

According to an embodiment of the invention, in the semiconductor structure, the collector may include a heavily doped region and a lightly doped region. The heavily doped region is located in the substrate. The lightly doped region is located in the substrate between the heavily doped region and the base.

According to an embodiment of the invention, the semiconductor structure may further include a first doped region and a second doped region. The first doped region and the second doped region are located in the base at two sides of the emitter and have the second conductive type.

According to an embodiment of the invention, the semiconductor structure may further include a protection layer. The protection layer is disposed between the base and the emitter and has an opening. The emitter passes through the opening and connects to the base.

According to an embodiment of the invention, the semiconductor structure may further include a spacer. The spacer is disposed on a sidewall of the emitter.

According to an embodiment of the invention, the semiconductor structure may further include a high resistivity material layer. The high resistivity material layer is disposed above the CMOS device and the BJT.

According to an embodiment of the invention, in the semiconductor structure, a resistivity of the high resistivity material layer is, for example, greater than 4000 Ω·cm.

According to an embodiment of the invention, in the semiconductor structure, a material of the high resistivity material layer is, for example, a high resistivity silicon, a glass, a quartz or a polymer material.

The invention provides a method of manufacturing a semiconductor structure, which includes the following steps. A substrate is provided. A CMOS device is formed on the substrate. The CMOS device includes an NMOS transistor and a PMOS transistor disposed on the substrate. A BJT is formed on the substrate. The BJT includes a collector, a base and an emitter. The collector is disposed in the substrate. The base is disposed on the substrate. The emitter is disposed on the base. A top surface of a channel of the NMOS transistor, a top surface of a channel of the PMOS transistor and a top surface of the collector of the BJT have the same height.

According to an embodiment of the invention, in the method of manufacturing the semiconductor structure, the BJT is, for example, an HBT.

According to an embodiment of the invention, in the method of manufacturing the semiconductor structure, the collector and the emitter may have a first conductive type, and the base may have a second conductive type.

According to an embodiment of the invention, in the method of manufacturing the semiconductor structure, a method of forming the collector may include the following steps. A heavily doped region is formed in the substrate. A lightly doped region is formed in the substrate between the heavily doped region and the base.

According to an embodiment of the invention, the method of manufacturing the semiconductor structure may further include forming a first doped region and a second doped region in the base at two sides of the emitter. The first doped region and the second doped region may have the second conductive type.

According to an embodiment of the invention, the method of manufacturing the semiconductor structure may further include forming a protection layer between the base and the emitter. The protection layer has an opening. The emitter passes through the opening and connects to the base.

According to an embodiment of the invention, the method of manufacturing the semiconductor structure may further include forming a spacer on a sidewall of the emitter.

According to an embodiment of the invention, the method of manufacturing the semiconductor structure may further include forming a high resistivity material layer above the CMOS device and the BJT.

According to an embodiment of the invention, in the method of manufacturing the semiconductor structure, the substrate is, for example, a semiconductor on insulator (SOI) substrate. The SOI substrate may include a substrate layer, an insulating layer and a semiconductor layer. The insulating layer is disposed on the substrate layer. The semiconductor layer is disposed on the insulating layer. The collector may be disposed in the semiconductor layer. The substrate layer may be removed after the high resistivity material layer is formed.

Based on the above description, in the semiconductor structure and the manufacturing method thereof according to the present invention, since the top surface of the channel of the NMOS transistor, the top surface of the channel of the PMOS transistor and the top surface of the collector of the BJT have the same height, the CMOS device and the BJT can be effectively integrated to enhance the overall performance of the semiconductor structure.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1M are schematic cross-sectional views illustrating a method of manufacturing a semiconductor structure according to an embodiment of the invention.

Figure 1A:
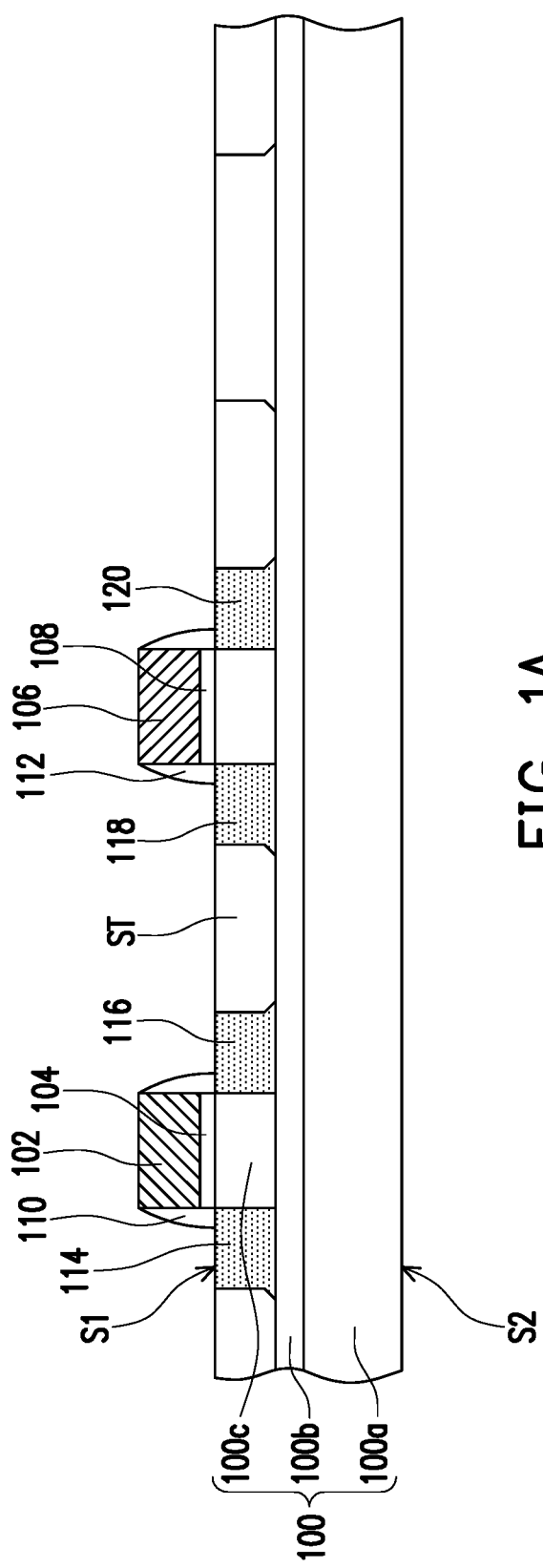
FIG. 1A to FIG. 1M are schematic cross-sectional views illustrating a method of manufacturing a semiconductor structure according to an embodiment of the invention.

Referring to FIG. 1A, a substrate 100 is provided. The substrate 100 has a first side S1 and a second side S2 opposite to each other. The first side S1 and the second side S2 may be one and the other of a front side and a back side of the substrate 100. In the present embodiment, the first side S1 is exemplified by the front side of the substrate 100, and the second side S2 is exemplified by the back side of the substrate 100, but the invention is not limited thereto.

In the present embodiment, the substrate 100 is exemplified by a SOI substrate, but the invention is not limited thereto. The SOI substrate may be a fully depleted SOI (FD SOI) or a partially depleted SOI (PD SOI). The substrate 100 may include a substrate layer 100a, an insulating layer 100b and a semiconductor layer 100c. A material of the substrate layer 100a is, for example, a semiconductor material, such as silicon. The insulating layer 100b is disposed on the substrate layer 100a. A material of the insulating layer 100b is, for example, silicon oxide. The semiconductor layer 100c is disposed on the insulating layer 100b. A material of the semiconductor layer 100c is, for example, silicon. Furthermore, the collector may be disposed in the semiconductor layer 100c. The substrate layer 100a may be removed after the high resistivity material layer is formed. An isolation structure ST may be formed in the substrate. The isolation structure ST is, for example, a shallow trench isolation (STI). A material of the isolation structure ST is, for example, silicon oxide.

A conductive layer 102, a dielectric layer 104, a conductive layer 106, and a dielectric layer 108 may be formed on the first side S1 of the substrate 100. The conductive layer 102 and the conductive layer 106 are respectively disposed on the substrate 100. In the present embodiment, the conductive layer 102 and the conductive layer 106 may be respectively disposed on the semiconductor layer 100c. The conductive layer 102 and the conductive layer 106 may respectively serve as a gate. The material of the conductive layer 102 and the conductive layer 106 is, for example, doped polysilicon. The dielectric layer 104 is disposed between the conductive layer 102 and the substrate 100. The dielectric layer 108 is disposed between the conductive layer 106 and the substrate 100. The dielectric layer 104 and the dielectric layer 108 may respectively serve as a gate dielectric layer. The material of the dielectric layer 104 and the dielectric layer 108 is, for example, silicon oxide.

Furthermore, a spacer 110 may be formed on a sidewall of the conductive layer 102, and a spacer 112 may be formed on a sidewall of the conductive layer 106. The spacer 110 and the spacer 112 may be respectively a single-layer structure or a multilayer structure. The material of the spacer 110 and the spacer 112 is, for example, silicon nitride, silicon oxide, or a combination thereof.

In addition, a doped region 114, a doped region 116, a doped region 118, and a doped region 120 may be formed in the substrate 100. In the present embodiment, the doped region 114, the doped region 116, the doped region 118, and the doped region 120 may be respectively disposed in the semiconductor layer 100c. The doped region 114, the doped region 116, the doped region 118 and the doped region 120 may respectively serve as a lightly doped drain (LDD). The doped region 114 and the doped region 116 are respectively exemplified by having an N-type conductivity type, and the doped region 118 and the doped region 120 are respectively exemplified by having a P-type conductivity type, but the invention is not limited thereto.

Figure 1B:
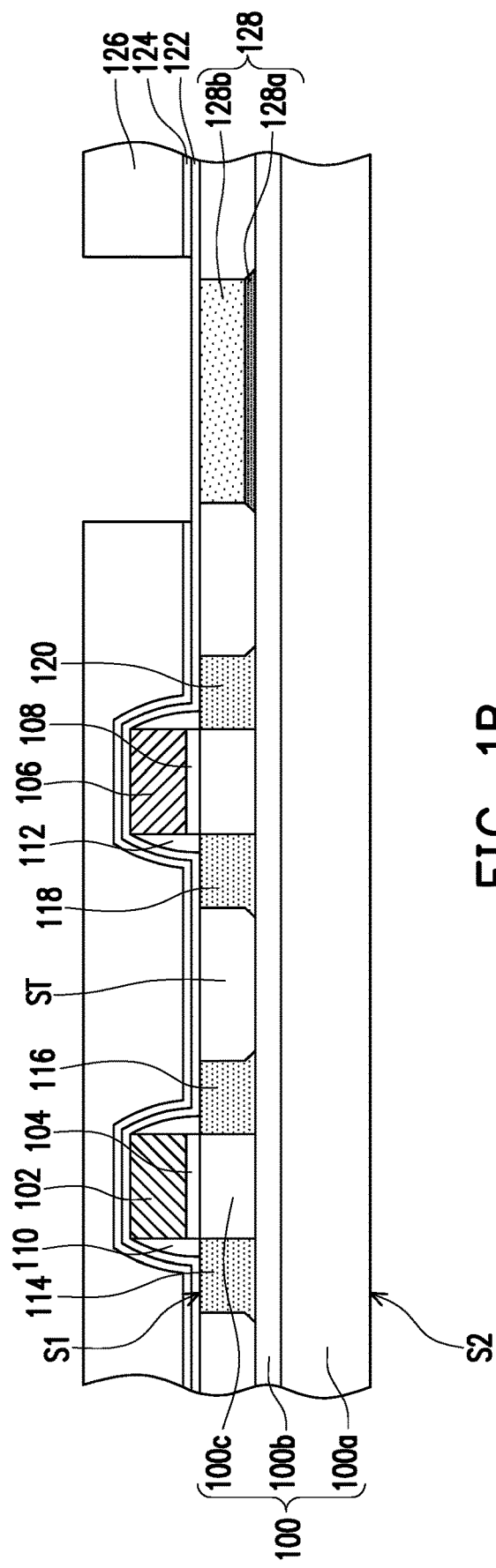

Referring to FIG. 1B, a protection layer 122 may be formed on the substrate 100. The material of the protection layer 122 is, for example, silicon oxide. The method of forming the protection layer 122 is, for example, a chemical vapor deposition (CVD) method.

A protection layer 124 may be formed on the protection layer 122. The material of the protection layer 124 is, for example, polysilicon. The method of forming the protection layer 124 is, for example, a CVD method.

A patterned photoresist layer 126 may be formed over the protection layer 124. The patterned photoresist layer 126 exposes a portion of the protection layer 124. The patterned photoresist layer 126 is formed, for example, by a lithography process.

The protection layer 124 exposed by the patterned photoresist layer 126 is removed. The method of removing the protection layer 124 is, for example, a wet etching method or a dry etching method.

A collector 128 is formed in the substrate 100 in the region exposed by the patterned photoresist layer 126. In the present embodiment, the collector 128 may be formed in the semiconductor layer 100c. The method of forming the collector 128 is, for example, performing an ion implantation process on the semiconductor layer 100c by using the patterned photoresist layer 126 as a mask.

The method of forming the collector 128 may include the following steps. A heavily doped region 128a is formed in the substrate 100 by using the patterned photoresist layer 126 as a mask. A lightly doped region 128b is formed in the substrate 100 above the heavily doped region 128a by using the patterned photoresist layer 126 as a mask. The collector 128 may include the heavily doped region 128a and the lightly doped region 128b. The lightly doped region 128b is closer to the first side S1 of the substrate 100 than the heavily doped region 128a. In the present embodiment, the heavily doped region 128a is formed first, and then the lightly doped region 128b is formed as an example, but the invention is not limited thereto. In another embodiment, the lightly doped region 128b may be formed first, and then the heavily doped region 128a is formed.

The collector 128 may have a first conductive type. Hereinafter, the first conductive type and the second conductive type may be one and the other of the N-type conductive type and the P-type conductive type, respectively. In the present embodiment, the first conductive type is exemplified by the N-type conductive type, and the second conductive type is exemplified by the P-type conductive type, but the invention is not limited thereto.

Figure 1C:
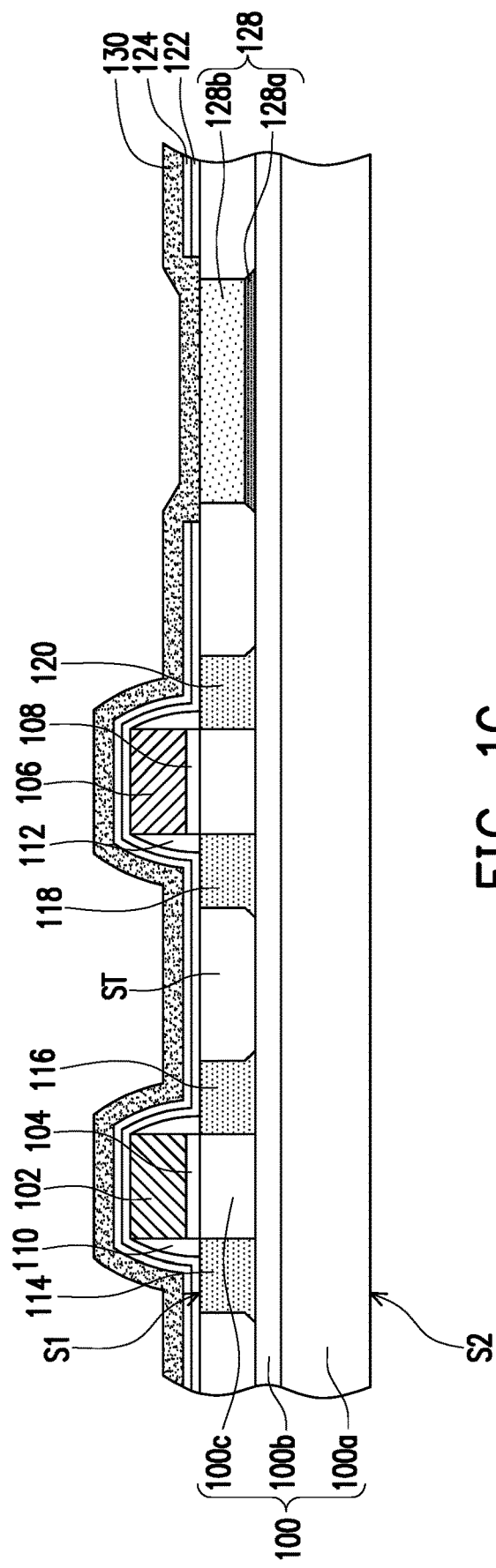

Referring to FIG. 1C, the patterned photoresist layer 126 is removed. The method of removing the patterned photoresist layer 126 is, for example, dry stripping or wet stripping.

The protection layer 122 exposed by the protection layer 124 is removed to expose the substrate 100. The method of removing the protection layer 122 is, for example, a wet etching method. The etchant used in the wet etching method is, for example, diluted hydrofluoric acid.

A base layer 130 may be formed on the protection layer 124 and the substrate 100. The base layer 130 may have the second conductive type (e.g., the P-type). The material of the base layer 130 may be a doped semiconductor material, such as a doped III-V semiconductor material. In the present embodiment, the material of the base layer 130 is exemplified by a doped SiGe, but the invention is not limited thereto. The method of forming the base layer 130 is, for example, an epitaxial growth with in-situ doping.

Figure 1D:
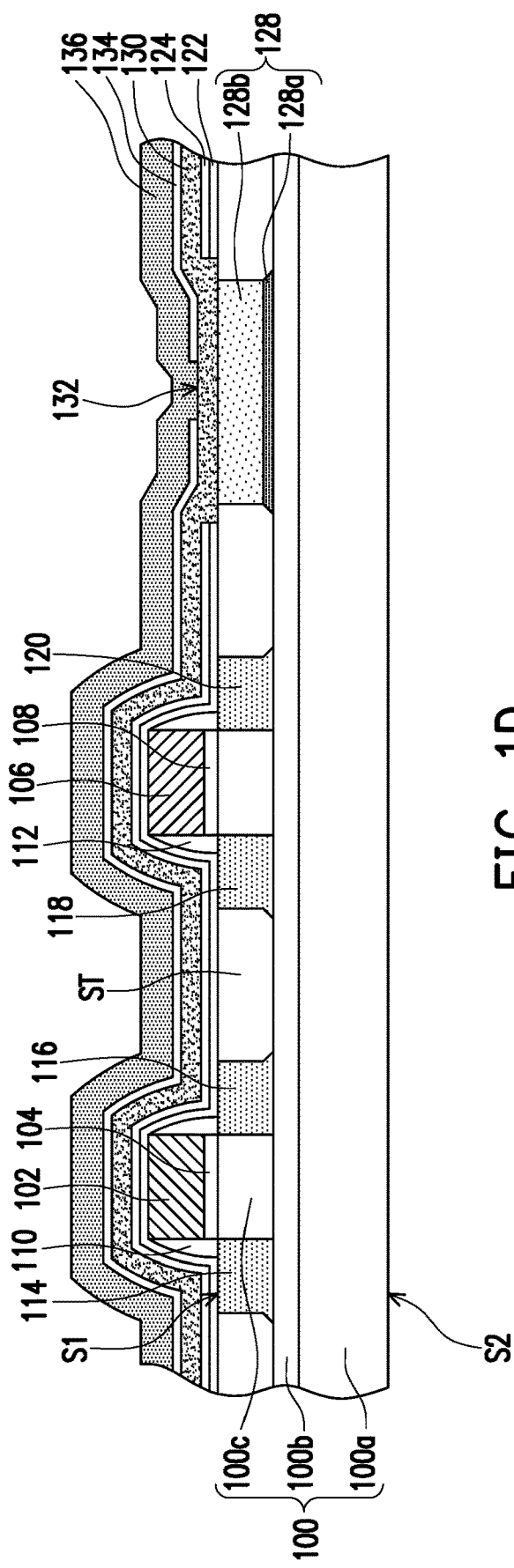

Referring to FIG. 1D, a protection layer 134 having an opening 132 may be formed on the base layer 130. The opening 132 exposes a portion of the base layer 130 above the collector 128. The protection layer 134 may be a single-layer structure or a multilayer structure. The material of the protection layer 134 is, for example, silicon oxide, silicon nitride or a combination thereof. The method of forming the protection layer 134 is, for example, forming a protection material layer (not shown) by a CVD method, and then patterning the protection material layer by a lithography process and an etching process.

An emitter layer 136 may be formed on the protection layer 134 and the base layer 130. The emitter layer 136 passes through the opening 132 and connects to the base layer 130. The emitter layer 136 may have the first conductive type (e.g., the N-type). The material of the emitter layer 136 is, for example, a doped semiconductor material. In the present embodiment, the material of the emitter layer 136 is exemplified by a doped polysilicon, but the invention is not limited thereto. The method of forming the doped polysilicon is an in-situ doping CVD method, or the method of forming the doped polysilicon is forming an undoped polysilicon first, and then doping the undoped polysilicon, for example.

Figure 1E:
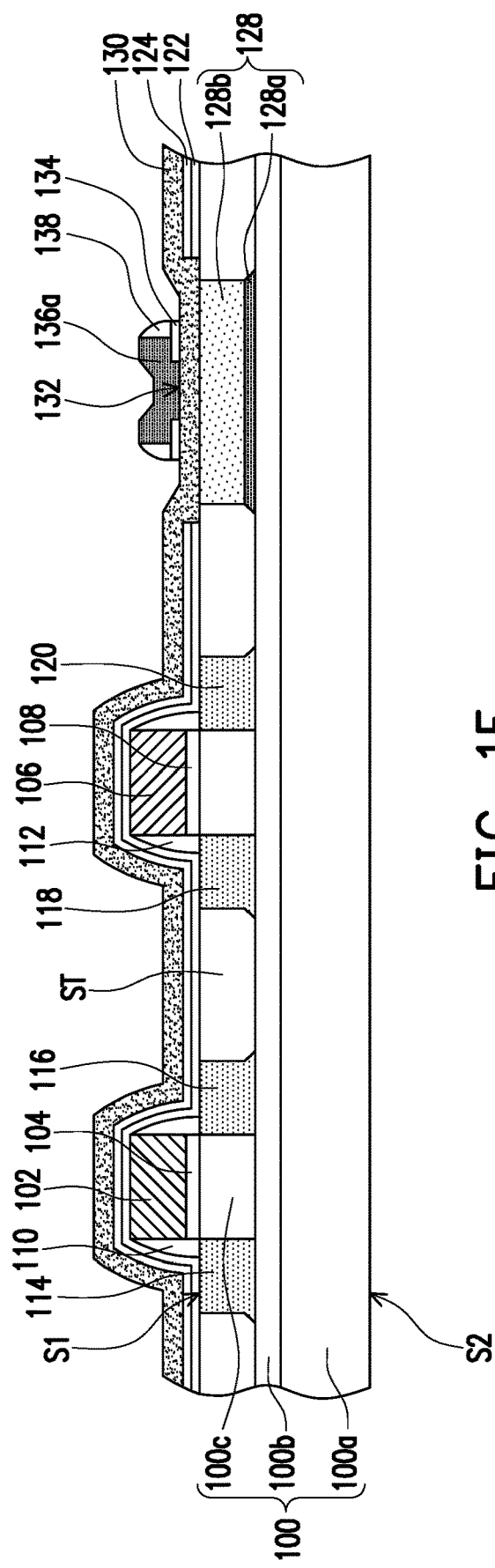

Referring to FIG. 1E, the emitter layer 136 may be patterned to form an emitter 136a. The patterning process performed on the emitter layer 136 is, for example, a combination of a lithography process and an etching process.

A spacer 138 may be formed on a sidewall of the emitter 136a. The spacer 138 may be a single-layer structure or a multilayer structure. The material of the spacer 138 is, for example, silicon nitride, silicon oxide or a combination thereof.

The protection layer 134 not covered by the emitter 136a and the spacers 138 may be removed. The method of removing the protection layer 134 not covered by the emitter 136a and the spacer 138 is, for example, a dry etching method or a wet etching method.

Figure 1F:
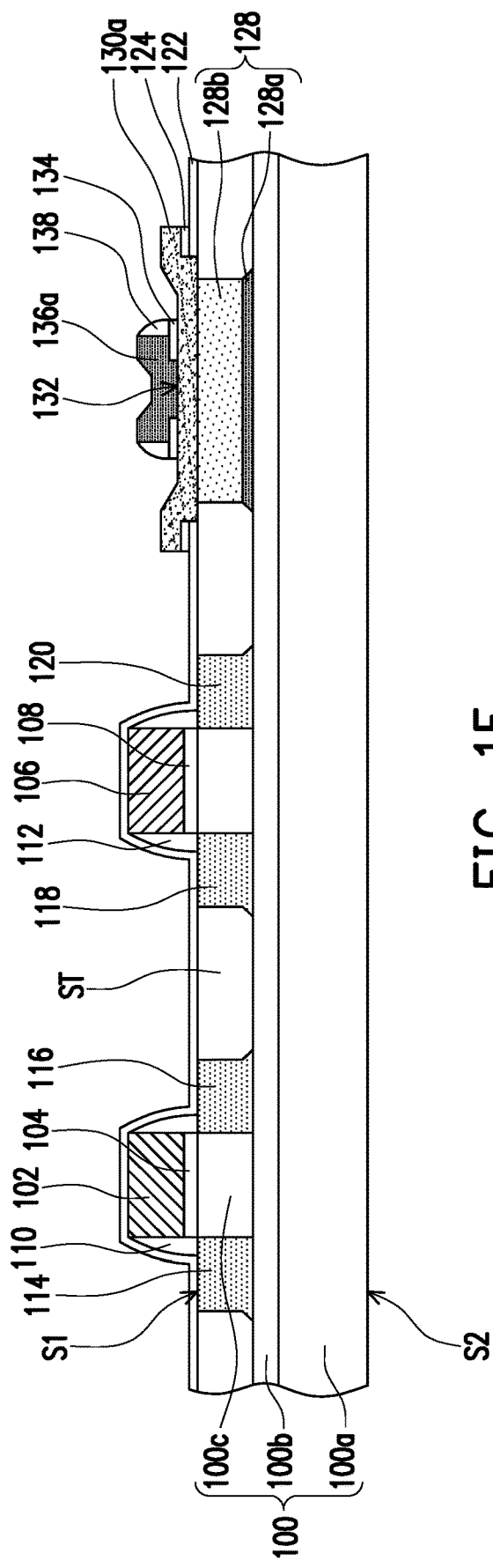

Referring to FIG. 1F, a patterning process may be performed on the base layer 130 to form the base 130a. The patterning process performed on the base layer 130 is, for example, a combination of a lithography process and an etching process.

The protection layer 124 not covered by the base 130a may be removed. The method of removing the protection layer 124 not covered by the base 130a is, for example, a wet etching method or a dry etching method.

Figure 1G:
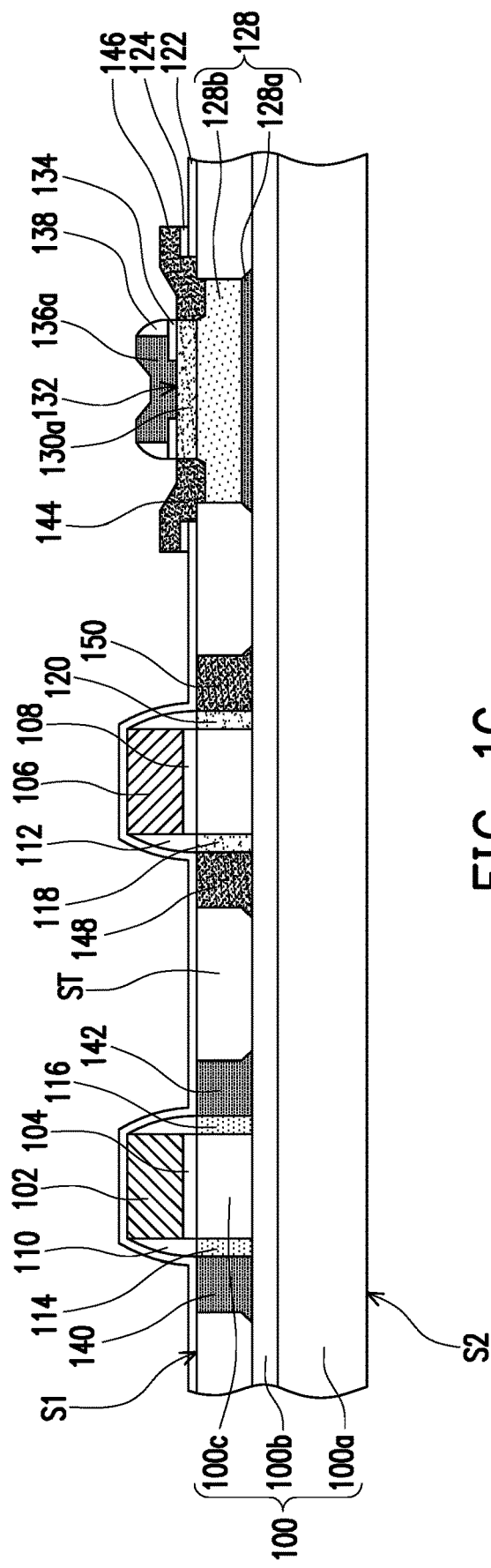

Referring to FIG. 1G, an N-type doped region 140 and an N-type doped region 142 may be formed in the substrate 100 at two sides of the conductive layer 102. In the present embodiment, the N-type doped region 140 and the N-type doped region 142 may be formed in the semiconductor layer 100c at two sides of the conductive layer 102. The doping concentrations of the N-type doped region 140 and the N-type doped region 142 may be greater than the doping concentrations of the doped region 114 and the doped region 116. The N-type doped region 140 and the N-type doped region 142 may be formed by performing an ion implantation process using an ion implantation mask.

A doped region 144 and a doped region 146 having the second conductive type (e.g., the P-type) may be formed in the base 130a at two sides of the emitter 136a. The doping concentrations of the doped region 144 and the doped region 146 may be greater than the doping concentration of the base 130a. In addition, a P-type doped region 148 and a P-type doped region 150 may be formed in the substrate 100 at two sides of the conductive layer 106. In the present embodiment, the P-type doped region 148 and the P-type doped region 150 may be formed in the semiconductor layer 100c at two sides of the conductive layer 106. The doping concentrations of the P-type doped region 148 and the P-type doped region 150 may be greater than the doping concentration of the doped region 118 and the doped region 120.

In the present embodiment, since the doped region 144 and the doped region 146 are exemplified by the P-type conductive type, the doped region 144, the doped region 146, the P-type doped region 148 and P-type doped region 150 may be formed by performing an ion implantation process using the same ion implantation mask, but the invention is not limited thereto. In another embodiment, the doped region 144, the doped region 146, the P-type doped region 148 and the P-type doped region 150 may be formed separately.

In addition, those having ordinary skill in the art adjust the order of the formation of the N-type doped region 140, the N-type doped region 142, the doped region 144, the doped region 146, the P-type doped region 148 and the P-type doped region 150 according to process requirements, the invention is not limited to the contents disclosed in the above embodiments.

Figure 1H:
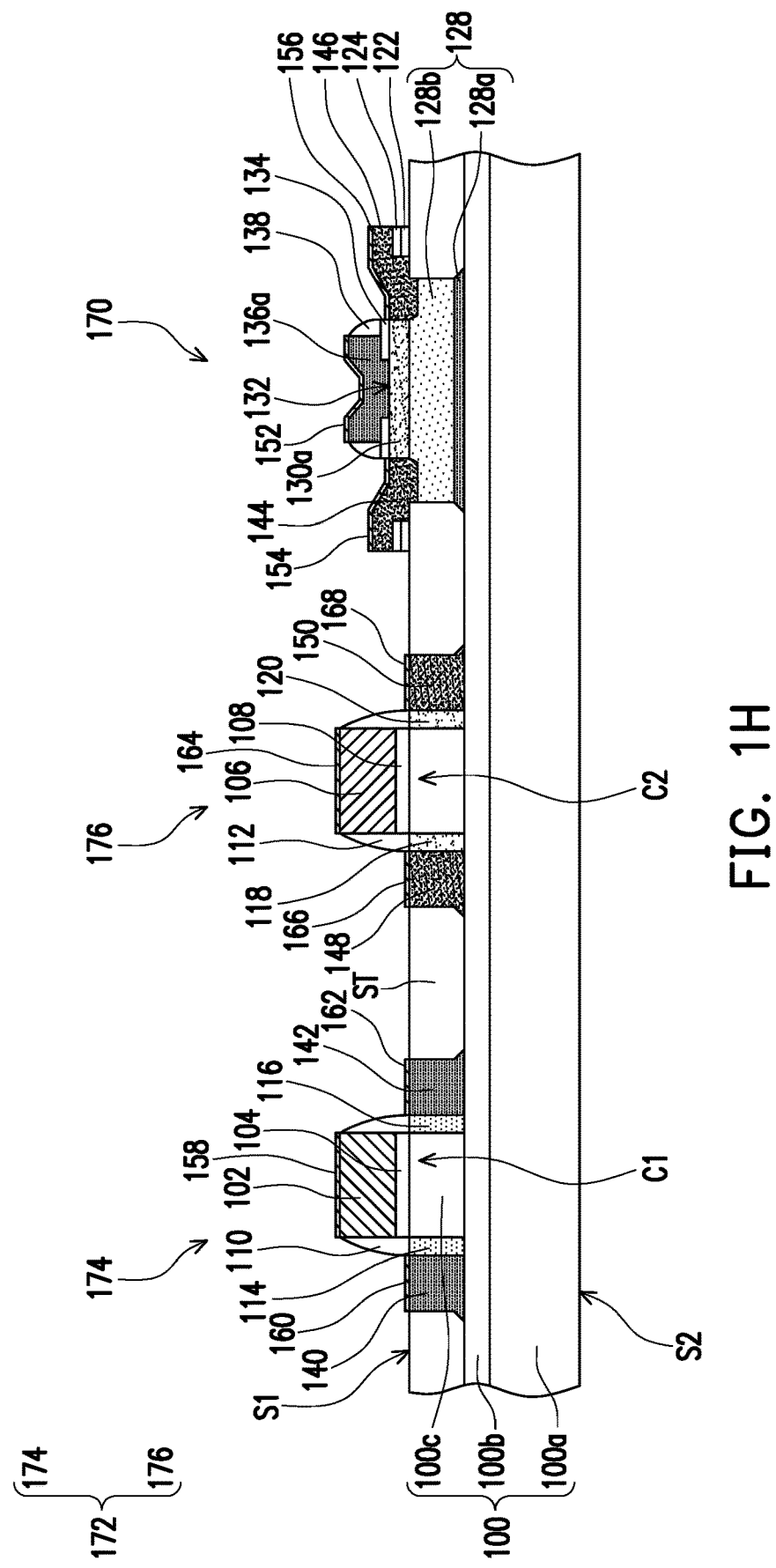

Referring to FIG. 1H, the protection layer 122 not covered by the doped region 144 and the doped region 146 may be removed. The method of removing the protection layer 122 not covered by the doped region 144 and the doped region 146 is, for example, a wet etching method. The etchant used in the wet etching method is, for example, diluted hydrofluoric acid.

A metal silicide layer 152, a metal silicide layer 154, a metal silicide layer 156, a metal silicide layer 158, a metal silicide layer 160, a metal silicide layer 162, a metal silicide layer 164, a metal silicide layer 166 and a metal silicide layer 168 may be formed on the emitter 136a, the doped region 144, the doped region 146, the conductive layer 102, the N-type doped region 140, the N-type doped region 142, the conductive layer 106, the P-type doped region 148 and the P-type doped region 150. The material of the metal silicide layer 152, the metal silicide layer 154, the metal silicide layer 156, the metal silicide layer 158, the metal silicide layer 160, the metal silicide layer 162, the metal silicide layer 164, the metal silicide layer 166 and the metal silicide layer 168 is, for example, cobalt silicide or nickel silicide. The method of forming the metal silicide layer 152, the metal silicide layer 154, the metal silicide layer 156, the metal silicide layer 158, the metal silicide layer 160, the metal silicide layer 162, the metal silicide layer 164, the metal silicide layer 166 and the metal silicide layer 168 is, for example, performing a salicidation process.

In addition, a BJT 170 and a CMOS device 172 may be formed at the first side S1 of the substrate 100 by the above method, but the method of manufacturing the BJT 170 and the CMOS device 172 of the invention is not limited thereto. The semiconductor structure of the present embodiment may be applied to a radio frequency front-end module (RF FEM). When the semiconductor structure of the present embodiment is applied to the RF FEM, the CMOS device 172 may be used to form a radio frequency switch (RF switch), and the BJT 170 may be used to form a power amplifier (PA).

The BJT 170 is located at the first side S1 of the substrate 100. The BJT 170 includes a collector 128, a base 130a and an emitter 136a. The BJT 170 is, for example, a heterojunction bipolar transistor (HBT). The collector 128 is disposed in the substrate 100. In the present embodiment, the collector 128 may be disposed in the semiconductor layer 100c. The collector 128 may include a heavily doped region 128a and a lightly doped region 128b. The heavily doped region 128a is located in the substrate 100. The lightly doped region 128b is located in the substrate 100 between the heavily doped region 128a and the base 130a. The base 130a is disposed on the substrate 100. The emitter 136a is disposed on the base 130a. The emitter 136a passes through the opening 132 of the protection layer 134 and connects to the base 130a. The collector 128 and the emitter 136a may have the first conductive type, and the base 130a may have the second conductive type.

The CMOS device 172 is located at the first side S1 of the substrate 100. CMOS device 172 includes NMOS transistor 174 and PMOS transistor 176 disposed on substrate 100.

The NMOS transistor 174 may include a conductive layer 102, a dielectric layer 104, an N-type doped region 140 and an N-type doped region 142, and may further include at least one of a doped region 114, a doped region 116, a spacer 110, the metal silicide layer 158, the metal silicide layer 160 and the metal silicide layer 162. The conductive layer 102 is disposed on the substrate 100. The channel C1 of the NMOS transistor 174 may be located in the substrate 100 below the conductive layer 102. The dielectric layer 104 is disposed between the conductive layer 102 and the substrate 100. The N-type doped region 140 and the N-type doped region 142 are disposed in the substrate 100 at two sides of the conductive layer 102. The N-type doped region 140 and the N-type doped region 142 may respectively serve as one and the other of a source and a drain. In the present embodiment, the N-type doped region 140 is exemplified by serving as a source, and the N-type doped region 142 is exemplified by serving as a drain, but the invention is not limited thereto. The doped region 114 is located between the N-type doped region 140 and the channel C1. The doped region 116 is located between the N-type doped region 142 and the channel C1. The spacer 110 is disposed on the sidewall of the conductive layer 102. The metal silicide layer 158, the metal silicide layer 160 and the metal silicide layer 162 are respectively located on the conductive layer 102, the N-type doped region 140 and the N-type doped region 142.

The PMOS transistor 176 may include a conductive layer 106, a dielectric layer 108, a P-type doped region 148 and a P-type doped region 150, and may further include at least one of a doped region 118, a doped region 120, a spacer 112, the metal silicide layer 164, the metal silicide layer 166, and the metal silicide layer 168. The conductive layer 106 is disposed on the substrate 100. The channel C2 of the PMOS transistor 176 may be located in the substrate 100 below the conductive layer 106. The dielectric layer 108 is disposed between the conductive layer 106 and the substrate 100. The P-type doped region 148 and the P-type doped region 150 are disposed in the substrate 100 at two sides of the conductive layer 106. The P-type doped region 148 and the P-type doped region 150 may respectively serve as one and the other of a source and a drain. In the present embodiment, the P-type doped region 148 is exemplified by serving as a source, and the P-type doped region 150 is exemplified by serving as a drain, but the invention is not limited thereto. The doped region 118 is located between the P-type doped region 148 and the channel C2. The doped region 120 is located between the P-type doped region 150 and the channel C2. The spacer 112 is disposed on the sidewall of the conductive layer 106. The metal silicide layer 164, metal silicide layer 166 and metal silicide layer 168 are respectively located on conductive layer 106, P-type doped region 148 and P-type doped region 150.

In the present embodiment, the PMOS transistor 176 is exemplified by being located between the NMOS transistor 174 and the BJT 170, but the invention is not limited thereto. Those having ordinary skill in the art may adjust the arrangement of the BJT 170, the NMOS transistor 174 and the PMOS transistor 176 according to product requirements.

Furthermore, the top surface of the channel C1 of the NMOS transistor 174 and the top surface of the channel C2 of the PMOS transistor 176 and the top surface of the collector 128 of the BJT 170 have the same height, so that the CMOS device 172 and the BJT 170 can be effectively integrated to enhance the overall performance of the semiconductor structure. In the present embodiment, the top surface of the channel C1 of the NMOS transistor 174, the top surface of the channel C2 of the PMOS transistor 176 and the top surface of the collector 128 of the BJT 170 are located at the first side S1 of the substrate 100, for example.

Figure 1I:
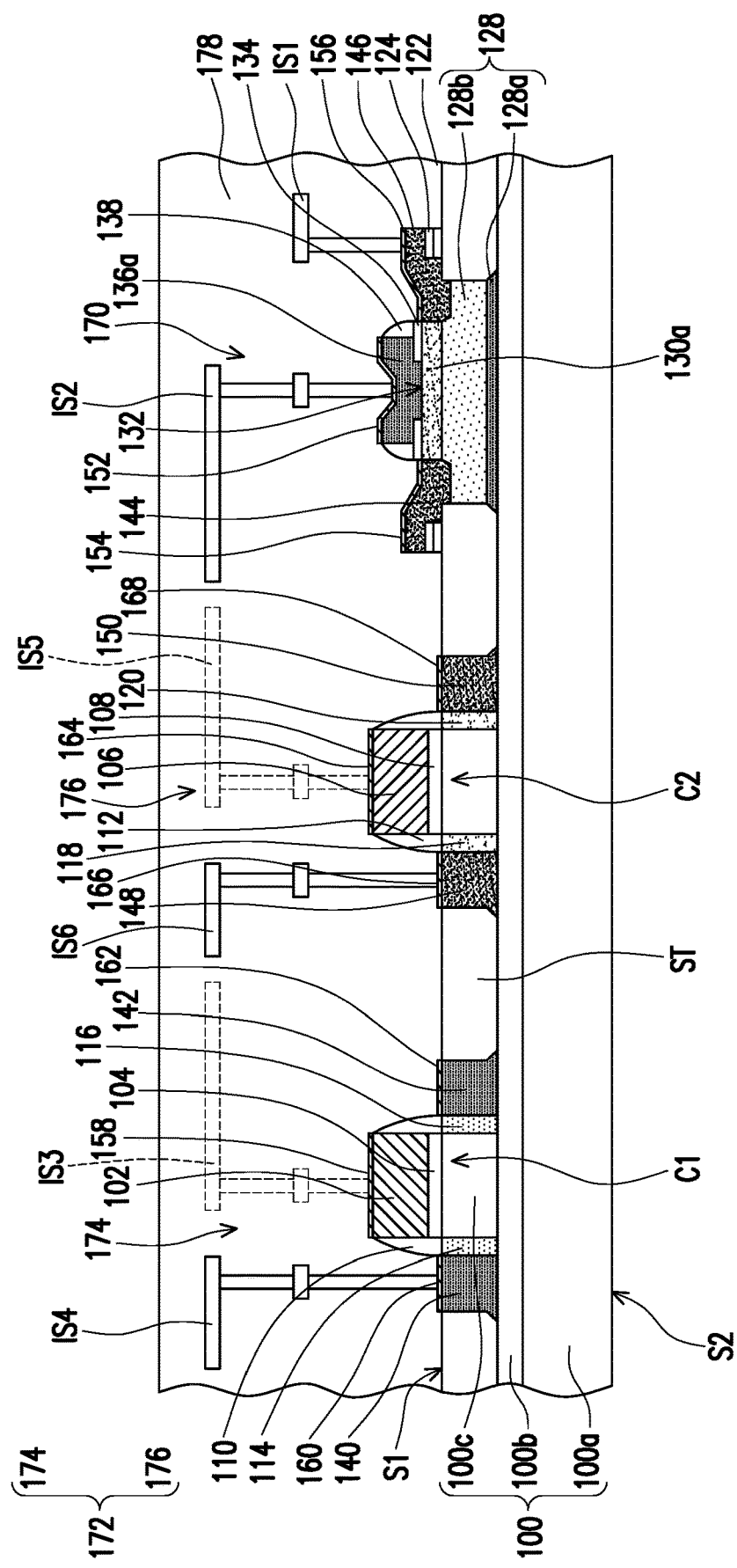

Referring to FIG. 1I, a dielectric layer 178 covering the BJT 170 and the CMOS device 172 may be formed. The dielectric layer 178 may be a multilayer structure. The material of the dielectric layer 178 is, for example, silicon oxide. The method of forming the dielectric layer 178 is, for example, a CVD method.

An interconnect structure IS1 electrically connected to the base 130a is formed at the first side S1 of the substrate 100.

The interconnect structure IS1 may be electrically connected to the base 130a by the metal silicide 156 and the doped region 146. An interconnect structure IS2 electrically connected to the emitter 136a may be formed at the first side S1 of the substrate 100. The interconnect structure IS2 may be electrically connected to the emitter 136a by the metal silicide 152. An interconnect structure IS3 electrically connected to the conductive layer 102 may be formed at the first side S1 of the substrate 100. The interconnect structure IS3 can be electrically connected to the conductive layer 102 by the metal silicide 158. An interconnect structure IS4 electrically connected to the N-type doped region 140 may be formed at the first side S1 of the substrate 100. The interconnect structure IS4 may be electrically connected to the N-type doped region 140 by the metal silicide 160. An interconnect structure IS5 electrically connected to the conductive layer 106 may be formed at the first side S1 of the substrate 100. The interconnect structure IS5 may be electrically connected to the conductive layer 106 by the metal silicide 164. An interconnect structure IS6 electrically connected to the P-type doped region 148 may be formed at the first side S1 of the substrate 100. The interconnect structure IS6 may be electrically connected to the P-type doped region 148 by the metal silicide 166. The interconnect structure IS1 to the interconnect structure IS6 may respectively include a contact, a conductive line or a combination thereof. The interconnect structure IS1 to the interconnect structure IS6 may be a multilayer interconnect structure. The material of the interconnect structure IS1 to the interconnect structure IS6 is, for example, tungsten, copper, aluminum or a combination thereof. The interconnect structure IS1 to the interconnect structure IS6 may be formed in the dielectric layer 178 by using a metal interconnect process.

Figure 1J:
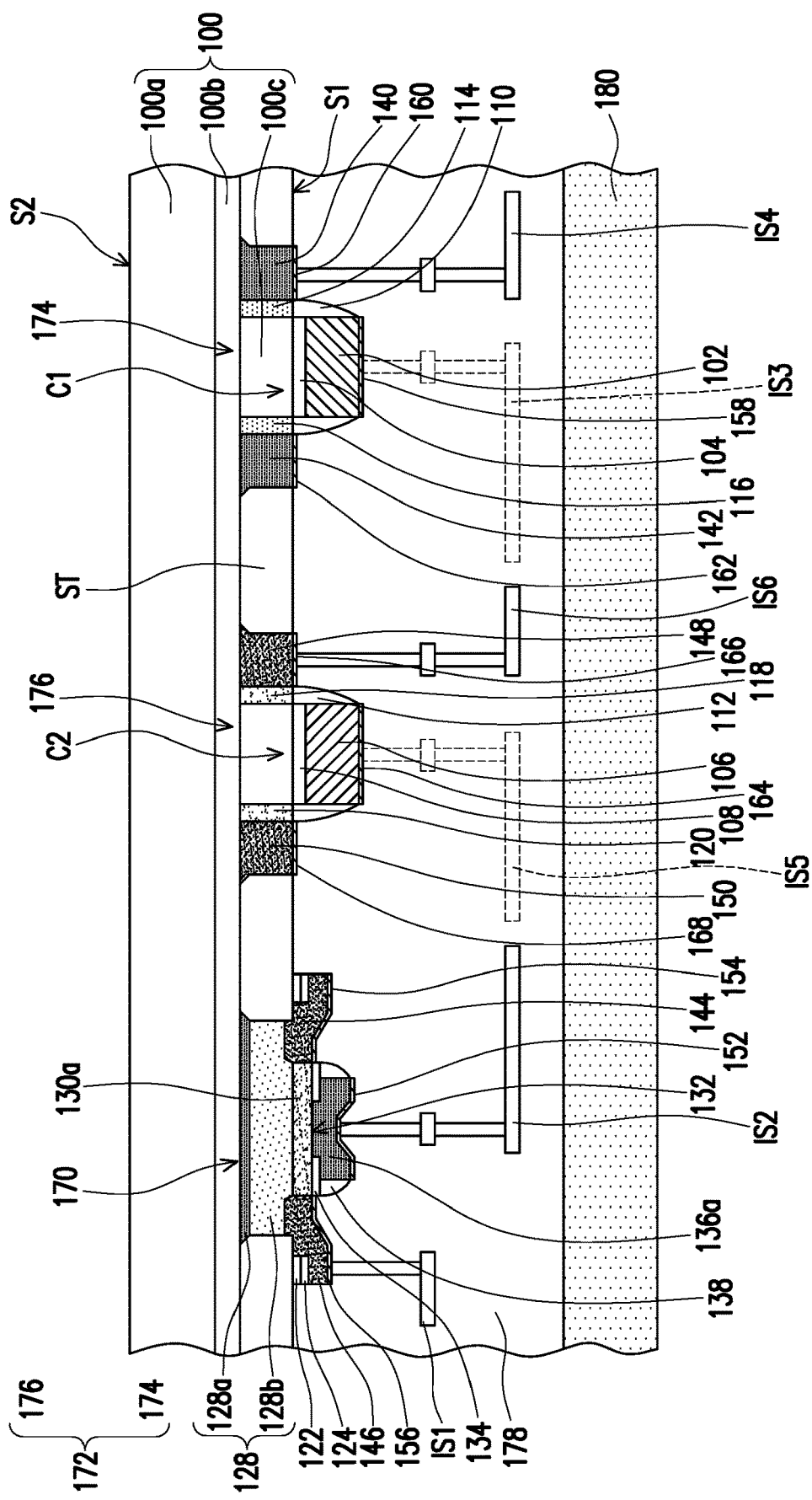

Referring to FIG. 1J, a high resistivity material layer 180 may be formed above the CMOS device 172 and the BJT 170. When the semiconductor structure of the present embodiment is applied to a RF FEM, the high resistivity material layer 180 may be used to reduce noise. The resistivity of the high resistivity material layer 180 is, for example, greater than 4000 Ω·cm. The material of the high resistivity material layer 180 is, for example, a high resistivity silicon, a glass, a quartz or a polymer material (e.g., a plastic material). The method of forming the high resistivity material layer 180 is, for example, flipping the wafer processed as described above, and bonding the semiconductor structure to the high resistivity material layer 180. In the present embodiment, the dielectric layer 178 of the semiconductor structure is bonded to the high resistivity material layer 180 as an example, but the invention is not limited thereto.

Figure 1K:
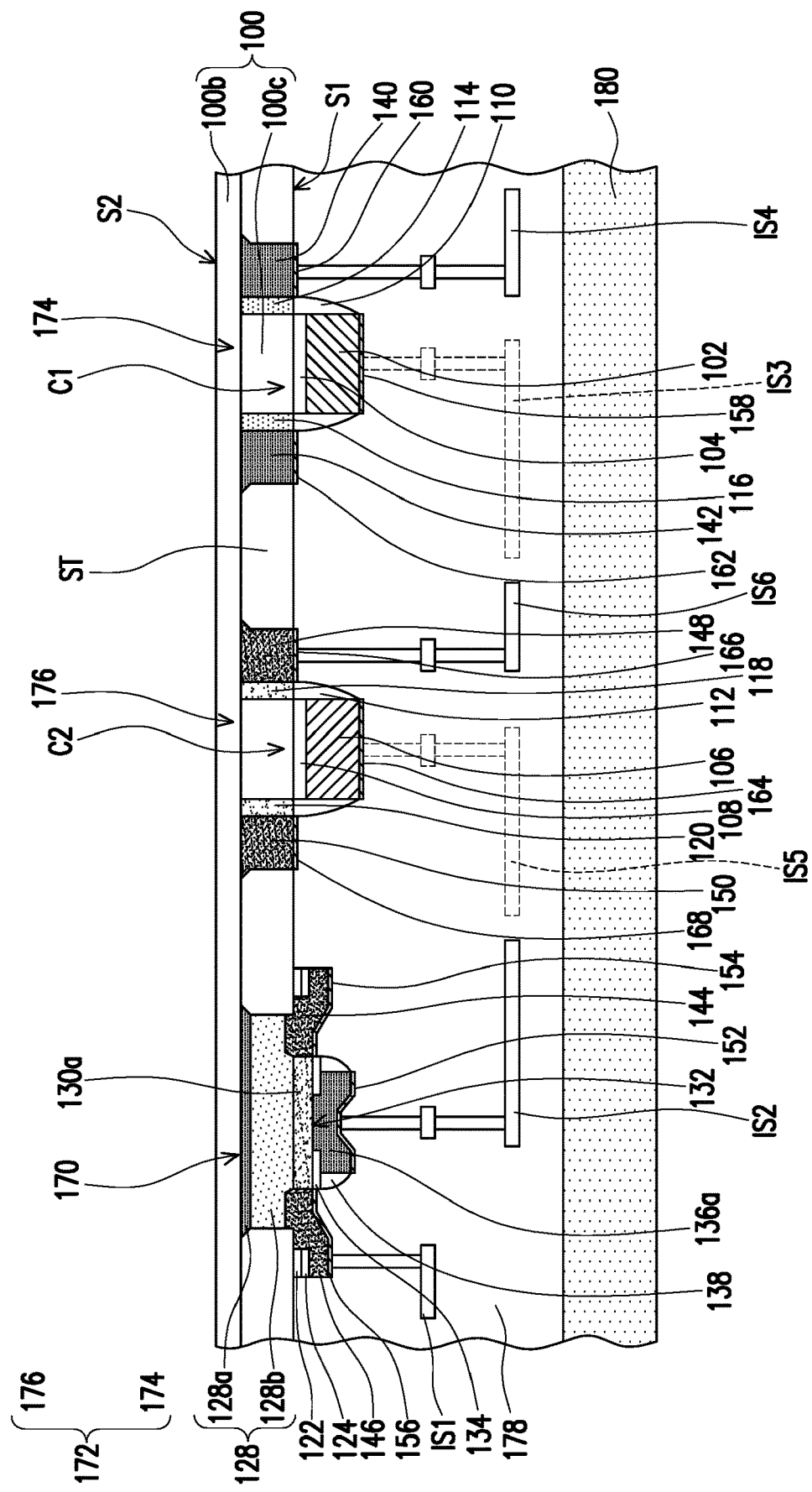

Referring to FIG. 1K, the substrate layer 100a may be removed. The method of removing the substrate layer 100a is, for example, a grinding method, a wet etching method, or a combination thereof.

Figure 1L:
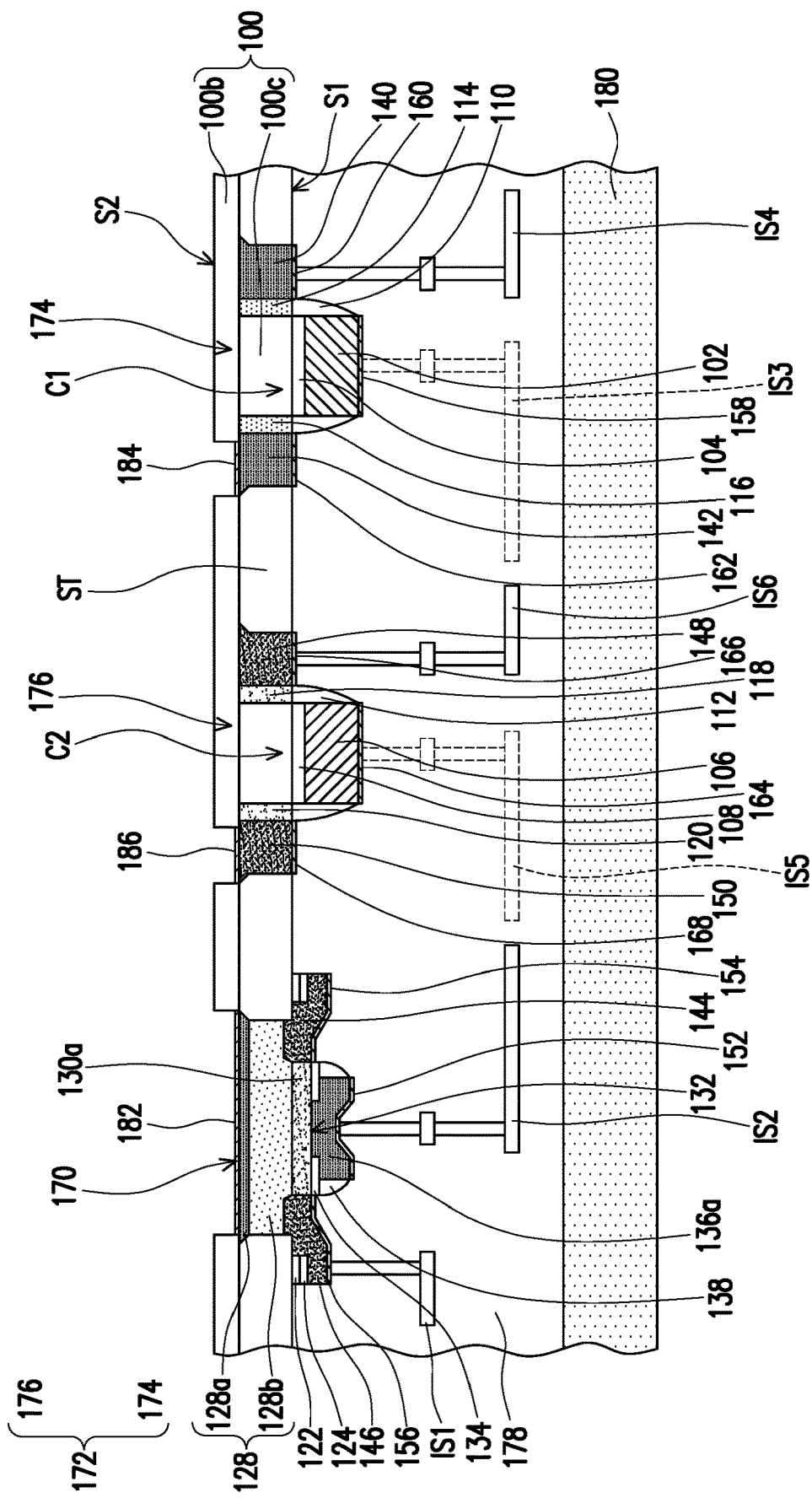

Referring to FIG. 1L, the insulating layer 100b may be patterned to expose the collector 128, the N-type doped region 142, and the P-type doped region 150. The patterning process performed on the insulating layer 100b is, for example, a combination of a lithography process and an etching process.

A metal silicide layer 182, a metal silicide layer 184 and a metal silicide layer 186 may be respectively formed on the collector 128, the N-type doped region 142 and the P-type doped region 150 exposed by the insulating layer 100b. The material of the metal silicide layer 182, the metal silicide layer 184 and the metal silicide layer 186 is, for example, cobalt silicide or nickel silicide. The method of forming the metal silicide layer 182, the metal silicide layer 184 and the metal silicide layer 186 is, for example, performing a salicidation process.

Moreover, the BJT 170 may further include the metal silicide layer 182 disposed on the collector 128 exposed by the insulating layer 100b. The NMOS transistor 174 may further include the metal silicide layer 184 disposed on the N-type doped region 142 exposed by the insulating layer 100b. The PMOS transistor 176 may further include the metal silicide layer 186 disposed on the P-type doped region 150 exposed by the insulating layer 100b.

Figure 1M:
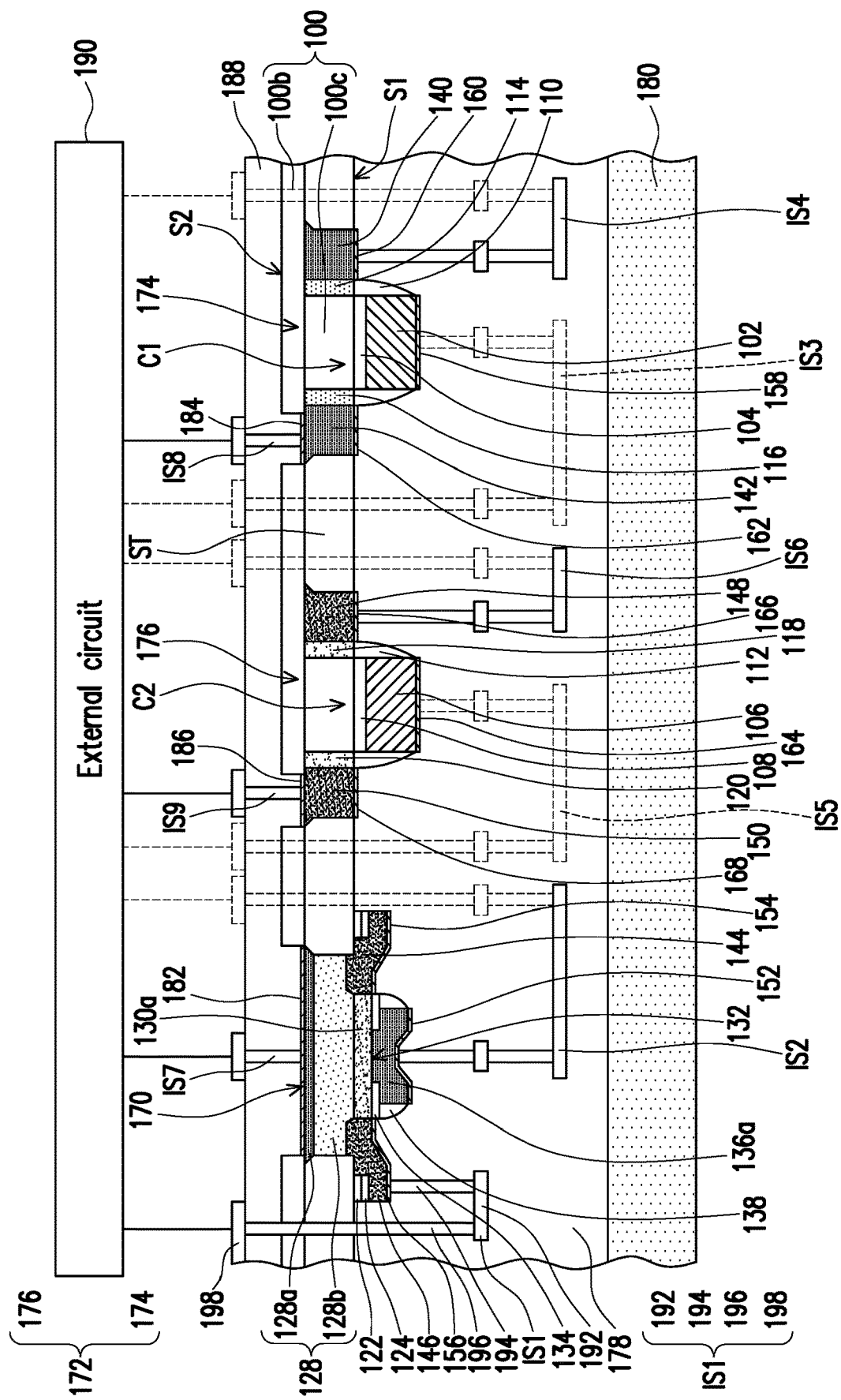

Referring to FIG. 1M, a dielectric layer 188 covering the insulating layer 100b, the metal silicide layer 182, the metal silicide layer 184 and the metal silicide layer 186 may be formed. The material of the dielectric layer 188 is, for example, silicon oxide. The method of forming the dielectric layer 188 is, for example, a CVD method.

An interconnect structure IS7 electrically connected to the collector 128 is formed at the second side S2 of the substrate 100. The interconnect structure IS7 may be electrically connected to the collector 128 by the metal silicide layer 182. An interconnect structure IS8 electrically connected to the N-type doped region 142 may be formed at the second side S2 of the substrate 100. The interconnect structure IS8 may be electrically connected to the N-type doped region 142 by the metal silicide layer 184. An interconnect structure IS9 electrically connected to the P-type doped region 150 may be formed at the second side S2 of the substrate 100. The interconnect structure IS9 may be electrically connected to the P-doped region 150 by the metal silicide layer 186. The interconnect structure IS7 to the interconnect structure IS9 may respectively include a contact, a conductive line or a combination thereof. The interconnect structure IS7 to the interconnect structure IS9 may be respectively a single-layer interconnect structure or a multilayer interconnect structure. The material of the interconnect structure IS7 to the interconnect structure IS9 is, for example, tungsten, copper, aluminum or a combination thereof. The interconnect structure IS7 to interconnect structure IS9 may be formed in the dielectric layer 188 by using a metal interconnect process and may extend onto the dielectric layer 188.

In addition, the interconnect structure IS1 to the interconnect structure IS6 may respectively extend to the second side S2 of the substrate 100. The interconnect structure IS1 to the interconnect structure IS9 may be respectively electrically connected to the external circuit 190 at the second side S2 of the substrate 100. Therefore, the external circuit 190 can be electrically connected to the interconnect structure IS1 to the interconnect structure IS9 to provide voltages to the corresponding electrodes in the BJT 170 and the CMOS device 172, respectively. The method of electrically connecting the external circuit 190 to the interconnect structure IS1 to the interconnect structure IS9 may use an electrical connection method well known in the art and will not be described herein.

For example, the interconnect structure IS1 may include a first metal layer 192, a first contact 194, a second contact 196, and a second metal layer 198. The first metal layer 192 is located at the first side S1 of the substrate 100. The first contact 194 is electrically connected between the first metal layer 192 and the base 130a. The second contact 196 is electrically connected to the first metal layer 192 and extending to the second side S2 of the substrate 100. The second metal layer 198 is located at the second side S2 of the substrate 100 and electrically connected to the second contact 196.

Furthermore, in the cross-sectional views of FIG. 1I to FIG. 1M, the interconnect structure shown by a dashed line is an interconnect structure not located on the cross section. In the present embodiment, the number of layers and the layout of the interconnect structure IS1 to the interconnect structure IS9 are not limited to those illustrated in the drawings, and those having ordinary skill in the art may adjust the number of layers and the layout of the interconnect structure IS1 to the interconnect structure IS9 according to product requirements.

Based on the above, the interconnect structure IS1 and the interconnect structure IS7 are respectively electrically connected to the base 130a and the collector 128, and a portion of the interconnect structure IS1 and the interconnect structure IS7 are located at different sides of the substrate 100. Therefore, the capacitance between the base 130a and the collector 128 in the BJT 170 can be reduced to enhance the overall performance of the semiconductor structure.

Moreover, the interconnect structure IS2 and the interconnect structure IS7 are respectively electrically connected to the emitter 136a and the collector 128, and a portion of the interconnect structure IS2 and the interconnect structure IS7 are located at different sides of the substrate 100. Therefore, the capacitance between the emitter 136a and the collector 128 in the BJT 170 can be reduced to further enhance the overall performance of the semiconductor structure.

Furthermore, the interconnect structure IS4 and the interconnect structure IS8 are respectively electrically connected to the N-type doped region 140 (source) and the N-type doped region 142 (drain), and a portion of the interconnect structure IS4 and the interconnect structure IS8 are located at different sides of the substrate 100. Therefore, the capacitance between the source and the drain in the NMOS transistor 174 can be reduced to further enhance the overall performance of the semiconductor structure.

On the other hand, the interconnect structure IS6 and the interconnect structure IS9 are respectively electrically connected to the P-type doped region 148 (source) and the P-type doped region 150 (drain), and a portion of the interconnect structure IS6 and the interconnect structure IS9 are located at different sides of the substrate 100. Therefore, the capacitance between the source and the drain in the PMOS transistor 176 can be reduced to further enhance the overall performance of the semiconductor structure.

Referring to FIG. 1K, in one embodiment, the semiconductor structure includes a substrate 100, a CMOS device 172 and a BJT 170, and may further include at least one of a doped region 144, a doped region 146, a protection layer 134, a spacer 138 and a high resistivity material layer 180. The substrate 100 may include an insulating layer 100b and a semiconductor layer 100c located on the insulating layer 100b.

The CMOS device 172 includes an NMOS transistor 174 and a PMOS transistor 176 disposed on the substrate 100. Regarding the details of the NMOS transistor 174 and the PMOS transistor 176, reference may be made to the above embodiments, and the description thereof is not repeated here.

The BJT 170 includes a collector 128, a base 130a and an emitter 136a. The BJT 170 is, for example, an HBT. The collector 128 is disposed in the substrate 100. In the present embodiment, the collector 128 may be disposed in the semiconductor layer 100c. The collector 128 may include a heavily doped region 128a and a lightly doped region 128b. The heavily doped region 128a is located in the substrate 100. The lightly doped region 128b is located in the substrate 100 between the heavily doped region 128a and the base 130a. The base 130a is disposed on the substrate 100. The emitter 136a is disposed on the base 130a. A top surface of a channel C1 of the NMOS transistor 174, a top surface of a channel C2 of the PMOS transistor 176 and a top surface of the collector 128 of the BJT 170 have the same height. The collector 128 and the emitter 136a may have a first conductive type (e.g., the N-type), and the base 130a may have a second conductive type (e.g., the P-type). Regarding the details of the BJT 170, reference may be made to the above embodiments, and the description thereof is not repeated here.

The doped region 144 and the doped region 146 are located in the base 130a at two sides of the emitter 136a and have the second conductive type (e.g., the P-type). The protection layer 134 is disposed between the base 130a and the emitter 136a and has an opening 132. The emitter 136a passes through the opening 132 and connects to the base 130a. The spacer 138 is disposed on a sidewall of the emitter 136a. The high resistivity material layer 180 is disposed above the CMOS device 172 and the BJT 170. The resistivity of the high resistivity material layer 180 is, for example, greater than 4000 Ω·cm. The material of the high resistivity material layer 180 is, for example, a high resistivity silicon, a glass, a quartz or a polymer material (e.g., a plastic material).

In addition, the material, the arrangement, the forming method, the effect, and the like of each component in the semiconductor structure of FIG. 1K are described in detail in the embodiments above and are not repeated herein.

Based on the above embodiments, in the semiconductor structure of FIG. 1K and the manufacturing method thereof, since the top surface of the channel C1 of the NMOS transistor 174, the top surface of the channel C2 of the PMOS transistor 176 and the top surface of the collector 128 of the BJT 170 have the same height, the CMOS device 172 and the BJT 170 can be effectively integrated to enhance the overall performance of the semiconductor structure.

Referring to FIG. 1M, in one embodiment, the semiconductor structure includes a substrate 100, a BJT 170, an interconnect structure IS1 and an interconnect structure IS7, and may further include at least one of a CMOS device 172, an interconnect structure IS2 to an interconnect structure IS6, an interconnect structure IS8, an interconnect structure IS9, a doped region 144, a doped region 146, a protection layer 134, a spacer 138 and a high resistivity material layer 180. The substrate 100 has a first side S1 and a second side S2 opposite to each other. The substrate 100 may include an insulating layer 100b and a semiconductor layer 100c located on the insulating layer 100b.

The BJT 170 is located at the first side S1 of the substrate 100. The BJT 170 includes a collector 128, a base 130a and an emitter 136a. The BJT 170 is, for example, an HBT. The collector 128 is disposed in the substrate 100. The base 130a is disposed on the substrate 100. In the present embodiment, the collector 128 may be disposed in the semiconductor layer 100c. The collector 128 may include a heavily doped region 128a and a lightly doped region 128b. The heavily doped region 128a is located in the substrate 100. The lightly doped region 128b is located in the substrate 100 between the heavily doped region 128a and the base 130a. The emitter 136a is disposed on the base 130a. The collector 128 and the emitter 136a may have a first conductive type (e.g., the N-type), and the base 130a may have a second conductive type (e.g., the P-type). Regarding the details of the BJT 170, reference may be made to the above embodiments, and the description thereof is not repeated here.

The CMOS device 172 is located at the first side S1 of the substrate 100. The CMOS device 172 may include an NMOS transistor 174 and a PMOS transistor 176. Regarding the details of the NMOS transistor 174 and the PMOS transistor 176, reference may be made to the above embodiments, and the description thereof is not repeated here. In addition, in the present embodiment, although the structures of the bipolar junction transistor 170 and the CMOS device 172 are as described above, the invention is not limited thereto.

The interconnect structure IS1 to the interconnect structure IS6 may be respectively located at the first side S1 of the substrate 100 and may be respectively electrically connected to the base 130a, the emitter 136a, the conductive layer 102, the N-type doped region 140, the conductive layer 106 and the P-type doped region 148. The interconnect structure IS7 to the interconnect structure IS9 may be respectively located at the second side S2 of the substrate 100 and may be respectively electrically connected to the collector 128, the N-type doped region 142 and the P-type doped region 150. The interconnect structure IS1 to the interconnect structure IS6 may further extend to the second side S2 of the substrate 100. The interconnect structure IS1 to the interconnect structure IS9 may be respectively electrically connected to an external circuit 190 at the second side S2 of the substrate 100.

The doped region 144 and the doped region 146 are located in the base 130a at two sides of the emitter 136a and have the second conductive type (e.g., the P-type). The interconnect structure IS1 may be electrically connected to doped region 144 or the doped region 146. The protection layer 134 is disposed between the base 130a and the emitter 136a and has an opening 132. The emitter 136a passes through the opening 132 and connects to the base 130a. The spacer 138 is disposed on a sidewall of the emitter 136a. The high resistivity material layer 180 is disposed above the CMOS device 172 and the BJT 170. The resistivity of the high resistivity material layer 180 is, for example, greater than 4000 Ω·cm. The material of the high resistivity material layer 180 is, for example, a high resistivity silicon, a glass, a quartz or a polymer material (e.g., a plastic material).

In addition, the material, the arrangement, the forming method, the effect, and the like of each component in the semiconductor structure of FIG. 1M are described in detail in the embodiments above and are not repeated herein.

Based on the above embodiments, in the semiconductor structure of FIG. 1M and the manufacturing method thereof, the interconnect structure IS1 and the interconnect structure IS7 are respectively electrically connected to the base 130a and the collector 128, and a portion of the interconnect structure IS1 and the interconnect structure IS7 are located at different sides of the substrate 100. Therefore, the capacitance between the base 130a and the collector 128 in the BJT 170 can be reduced to enhance the overall performance of the semiconductor structure.

In summary, in the semiconductor structure of one embodiment and the method of manufacturing the same, the CMOS device and the BJT can be effectively integrated to enhance the overall performance of the semiconductor structure. In the semiconductor structure of one embodiment and the method of manufacturing the same, the capacitance between the base and the collector of in the BJT of the semiconductor structure can be reduced to enhance the overall performance of the semiconductor structure.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:
   a substrate, wherein the substrate has a first side and a second side opposite to each other;
   a complementary metal oxide semiconductor (CMOS) device, comprising an N-type metal oxide semiconductor (NMOS) transistor and a P-type metal oxide semiconductor (PMOS) transistor disposed on the substrate;
   a bipolar junction transistor (BJT), comprising:
      a collector, disposed in the substrate;
      a base, disposed on the first side of the substrate; and
      an emitter, disposed on the base, wherein
   a top surface of a channel of the NMOS transistor, a top surface of a channel of the PMOS transistor and a top surface of the collector of the BJT have the same height; and
   a first interconnect structure, electrically connected to the base at the first side of the substrate and extending to the second side of the substrate.

2. The semiconductor structure according to claim 1, further comprising:
   a second interconnect structure, electrically connected to the collector at the second side of the substrate.

3. The semiconductor structure according to claim 2, wherein a portion of the first interconnect structure and the second interconnect structure are located at different sides of the substrate.

4. The semiconductor structure according to claim 2, further comprising:
   a third interconnect structure, electrically connected to the emitter at the first side of the substrate and extending to the second side of the substrate.

5. The semiconductor structure according to claim 4, wherein a portion of the third interconnect structure and the second interconnect structure are located at different sides of the substrate.

6. The semiconductor structure according to claim 1, wherein the first interconnect structure comprises:
   a first metal layer, located at the first side of the substrate;
   a first contact, electrically connected between the first metal layer and the base;
   a second contact, electrically connected to the first metal layer and extending to the second side of the substrate; and
   a second metal layer, located at the second side of the substrate and electrically connected to the second contact.

7. The semiconductor structure according to claim 1, wherein the substrate comprises an insulating layer and a semiconductor layer located on the insulating layer, and the collector is disposed in the semiconductor layer.

8. The semiconductor structure according to claim 1, wherein the BJT comprises a heterojunction bipolar transistor (HBT).

9. The semiconductor structure according to claim 1, wherein the collector and the emitter have a first conductive type, and the base has a second conductive type.

10. The semiconductor structure according to claim 9, wherein the collector comprises:
    a heavily doped region, located in the substrate; and
    a lightly doped region, located in the substrate between the heavily doped region and the base.

11. The semiconductor structure according to claim 9, further comprising:
a first doped region and a second doped region, located in the base at two sides of the emitter and having the second conductive type.

12. The semiconductor structure according to claim 1, further comprising:
a protection layer, disposed between the base and the emitter and having an opening, wherein the emitter passes through the opening and connects to the base.

13. The semiconductor structure according to claim 1, further comprising:
a spacer, disposed on a sidewall of the emitter.

14. The semiconductor structure according to claim 1, further comprising:
a high resistivity material layer, disposed above the CMOS device and the BJT.

15. The semiconductor structure according to claim 14, wherein a resistivity of the high resistivity material layer is greater than 4000 Ω·cm.

16. The semiconductor structure according to claim 14, wherein a material of the high resistivity material layer comprises a high resistivity silicon, a glass, a quartz or a polymer material.

17. A method of manufacturing a semiconductor structure, comprising:
providing a substrate, wherein the substrate has a first side and a second side opposite to each other;
forming a CMOS device on the substrate, wherein the CMOS device comprises an NMOS transistor and a PMOS transistor disposed on the substrate;
forming a BJT on the substrate, wherein the BJT comprises:
a collector, disposed in the substrate;
a base, disposed on the first side of the substrate; and
an emitter, disposed on the base, wherein
a top surface of a channel of the NMOS transistor, a top surface of a channel of the PMOS transistor and a top surface of the collector of the BJT have the same height; and
forming a first interconnect structure, wherein the first interconnect structure is electrically connected to the base at the first side of the substrate and extends to the second side of the substrate.

18. The method of manufacturing the semiconductor structure according to claim 17, further comprising:
forming a second interconnect structure, wherein the second interconnect structure is electrically connected to the collector at the second side of the substrate.

19. The method of manufacturing the semiconductor structure according to claim 17, further comprising:
forming a third interconnect structure, wherein the third interconnect structure is electrically connected to the emitter at the first side of the substrate and extends to the second side of the substrate.

20. The method of manufacturing the semiconductor structure according to claim 17, wherein the first interconnect structure comprises:
a first metal layer, located at the first side of the substrate;
a first contact, electrically connected between the first metal layer and the base;
a second contact, electrically connected to the first metal layer and extending to the second side of the substrate; and
a second metal layer, located at the second side of the substrate and electrically connected to the second contact.

21. The method of manufacturing the semiconductor structure according to claim 17, wherein the BJT comprises an HBT.

22. The method of manufacturing the semiconductor structure according to claim 17, wherein the collector and the emitter have a first conductive type, and the base has a second conductive type.

23. The method of manufacturing the semiconductor structure according to claim 22, wherein a method of forming the collector comprises:
forming a heavily doped region in the substrate; and
forming a lightly doped region in the substrate between the heavily doped region and the base.

24. The method of manufacturing the semiconductor structure according to claim 22, further comprising:
forming a first doped region and a second doped region in the base at two sides of the emitter, wherein the first doped region and the second doped region have the second conductive type.

25. The method of manufacturing the semiconductor structure according to claim 17, further comprising:
forming a protection layer between the base and the emitter, wherein the protection layer has an opening, and the emitter passes through the opening and connects to the base.

26. The method of manufacturing the semiconductor structure according to claim 17, further comprising:
forming a spacer on a sidewall of the emitter.

27. The method of manufacturing the semiconductor structure according to claim 17, further comprising:
forming a high resistivity material layer above the CMOS device and the BJT.

28. The method of manufacturing the semiconductor structure according to claim 27, wherein the substrate comprises a semiconductor on insulator (SOI) substrate, and the SOI substrate comprises:
a substrate layer;
an insulating layer, disposed on the substrate layer; and
a semiconductor layer, disposed on the insulating layer, wherein
the collector is disposed in the semiconductor layer, and the substrate layer is removed after the high resistivity material layer is formed.

* * * * *